United States Patent
Igarashi et al.

(10) Patent No.: US 9,536,797 B2
(45) Date of Patent: Jan. 3, 2017

(54) SUBSTRATE TREATMENT APPARATUS AND SUBSTRATE TREATMENT METHOD

(71) Applicant: KABUSHIKI KAISHA TOSHIBA, Minato-ku (JP)

(72) Inventors: Junichi Igarashi, Nagoya (JP); Katsuhiro Sato, Yokkaichi (JP); Keiko Morita, Tama (JP); Hideaki Hirabayashi, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 78 days.

(21) Appl. No.: 14/614,834

(22) Filed: Feb. 5, 2015

(65) Prior Publication Data

US 2016/0025410 A1  Jan. 28, 2016

(30) Foreign Application Priority Data

Jul. 22, 2014 (JP) .................. 2014-148780

(51) Int. Cl.
    *F26B 5/04* (2006.01)
    *H01L 21/66* (2006.01)

(52) U.S. Cl.
    CPC ............. *H01L 22/26* (2013.01); *H01L 22/12* (2013.01)

(58) Field of Classification Search
    CPC ................. F26B 3/00; F26B 5/00; F26B 5/04; F26B 19/00; F26B 21/00; H01L 21/00; H01L 21/02057; H01L 21/68; G03F 7/00; G03F 7/162; G03F 7/405
    USPC ................. 34/77, 78, 404, 413; 134/26, 28; 156/345.15; 216/41, 83, 94; 118/723 IR
    See application file for complete search history.

(56) References Cited

U.S. PATENT DOCUMENTS

| | | | | |
|---|---|---|---|---|
| 4,828,369 A | * | 5/1989 | Hotomi | G02F 1/1525 118/723 IR |
| 4,846,926 A | * | 7/1989 | Kay | C30B 25/02 117/109 |
| 5,242,537 A | * | 9/1993 | Nelson | H01L 37/02 204/298.36 |
| 6,531,234 B1 | * | 3/2003 | Higashi | H01L 51/0025 252/301.34 |
| 7,531,156 B2 | * | 5/2009 | Ando | B01J 10/007 423/447.1 |
| 7,939,183 B2 | * | 5/2011 | Iwakuma | C09K 11/06 252/301.16 |
| 9,213,242 B2 | * | 12/2015 | Uozumi | G03F 7/162 |
| 2013/0008868 A1 | | 1/2013 | Uozumi et al. | |

(Continued)

FOREIGN PATENT DOCUMENTS

| JP | 9 190996 | 7/1997 |
|---|---|---|
| JP | 2008 10638 | 1/2008 |

(Continued)

*Primary Examiner* — Stephen M Gravini
(74) *Attorney, Agent, or Firm* — Oblon, McClelland, Maier & Neustadt, L.L.P.

(57) ABSTRACT

A substrate treatment apparatus includes a processing chamber configured to be capable of storing a substrate; a substrate holder disposed in the processing chamber and configured to be capable of holding the substrate; a sublimation removing unit configured to remove, by sublimation, a sublimating material filled between structures formed on a surface of a substrate held by the substrate holder, and a sublimation status detecting unit configured to detect a progress or an end point of sublimation removal of the sublimating material.

13 Claims, 8 Drawing Sheets

(56) References Cited

U.S. PATENT DOCUMENTS

2014/0295062 A1* 10/2014 Chiyoma ............... G01T 1/202
                                                      427/74
2016/0025410 A1*  1/2016 Igarashi ............... H01L 21/306
                                                      34/404

FOREIGN PATENT DOCUMENTS

| JP | 4833753 | 12/2011 | | |
|----|---------|---------|---|---|
| JP | 2012 243869 | 12/2012 | | |
| JP | 2013 16699 | 1/2013 | | |
| JP | 2013 33817 | 2/2013 | | |
| JP | 2013 42093 | 2/2013 | | |
| JP | 2013 42094 | 2/2013 | | |
| JP | 2013 258272 | 12/2013 | | |
| JP | 2014 11426 | 1/2014 | | |
| JP | 5622675 B2 * | 11/2014 | ............. | G03F 7/162 |
| JP | 2015-106645 A | 6/2015 | | |

* cited by examiner

SUBSTRATE TREATMENT APPARATUS AND SUBSTRATE TREATMENT METHOD

CROSS-REFERENCE TO RELATED APPLICATION(S)

This application is based upon and claims the benefit of priority from Japanese Patent Application No. 2014-148780, filed on, Jul. 22, 2014 the entire contents of which are incorporated herein by reference.

FIELD

Embodiments disclosed herein generally relate to a substrate treatment apparatus and a substrate treatment method.

BACKGROUND

After a liquid processing of a substrate such as substrate cleaning, the substrate needs to be dried by removing the liquid on the surface of the substrate. For example, an attempt to remove the liquid on the substrate by vaporization may cause fine structures formed on the substrate to collapse by liquid surface tension. A drying method utilizing a sublimating material is being proposed to prevent the collapse of such structures.

The method of drying the substrate using a sublimating material begins with supplying a liquid containing a sublimating material to the surface of the substrate. The supplied liquid substitutes the cleaning liquid remaining on the substrate surface which was used in the cleaning of the substrate surface. Then, the liquid containing the sublimating material is vaporized to cause the sublimating material to precipitate in the spaces between the structures. As a result, the spaces between the structures are filled with solids of the sublimating material. Then the precipitate of the sublimating material is removed by sublimation to dry the substrate surface. In the above described method, it is possible to prevent the collapse of the structures caused by liquid surface tension since the structures are supported by solids of sublimating materials filled between the spaces of the structures.

Conventionally, the process of removing the sublimating material by sublimation was controlled, for example, by time. Thus, the determination of whether or not the sublimating material has sublimated sufficiently from the substrate surface was made, for example, by the eyes of the operator or by using SEM (Scanning Electron Microscope). Thus, it was difficult to properly detect the progress or the end point, i.e. end period of the process for removing the sublimating material by sublimation and end the process by such proper detection.

DESCRIPTION

In one embodiment, a substrate treatment apparatus includes a processing chamber configured to be capable of storing a substrate; a substrate holder disposed in the processing chamber and configured to be capable of holding the substrate; a sublimation removing unit configured to remove, by sublimation, a sublimating material filled between structures formed on a surface of a substrate held by the substrate holder, and a sublimation status detecting unit configured to detect a progress or an end point of sublimation removal of the sublimating material.

In one embodiment, a method of treating a substrate includes supplying a sublimating material containing liquid containing a sublimating material to a substrate having structures formed on a surface thereof; precipitating the sublimating material between the structures by vaporizing the sublimating material containing liquid supplied to the surface of the substrate; removing, by sublimation, the sublimating material existing between the structures; and detecting a progress or an end point of removing the sublimating material by sublimation.

(Embodiments)

Embodiments are described herein with reference to the accompanying drawings. Structures substantially identical across the embodiments are identified with identical reference symbols and are not re-described. The drawings are schematic and are not necessarily consistent with the actual relation between thickness and planar dimensions as well as the ratio of thicknesses between different layers, etc.

(First Embodiment)

With reference to the accompanying drawings, a first embodiment is described through, but not limited to, a semiconductor device manufacturing apparatus application which is used as an example for discussing a substrate treatment apparatus and a substrate treatment method.

[Structure]

Figure 1:
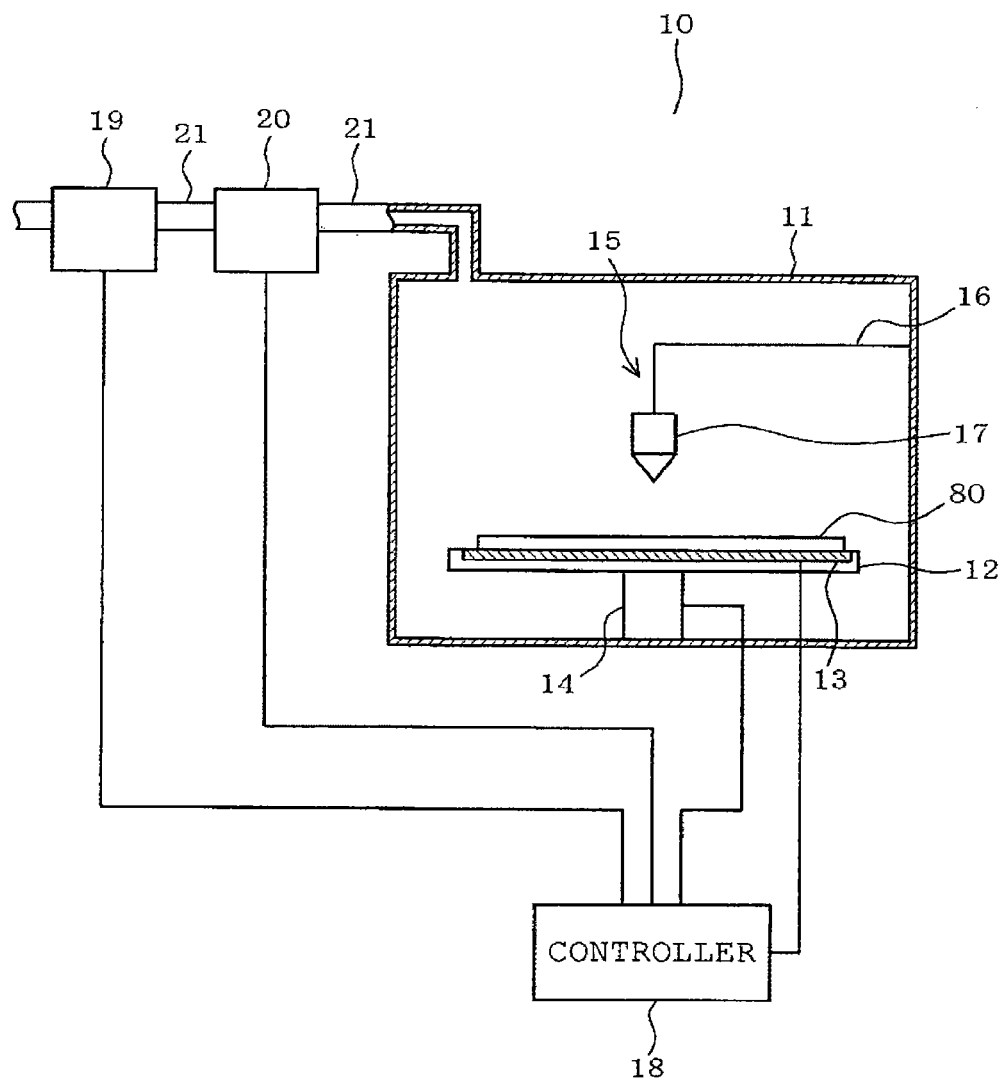
FIG. 1 pertains to a first embodiment and illustrates one example of the overall structure of a substrate treatment apparatus.

First, a description will be given on the structure of substrate treatment apparatus 10 illustrated in FIG. 1. Substrate treatment apparatus 10 is configured to execute a liquid treatment using liquids such as a cleaning liquid and a drying treatment following the liquid treatment. Substrate treatment apparatus 10 of the first embodiment is configured for treatment of substrates of semiconductor devices having patterns formed therein. Substrate treatment apparatus 10 may be used for example for executing a substrate cleaning and substrate drying processes. Examples of substrates which may be treated by substrate treatment apparatus 10 include a silicon wafer, a silicon carbide wafer, a wafer formed of multiple components including a silicon element, a sapphire wafer, various types of compound semiconductor wafers, a plastic wafer, a glass substrate, or the like. Patterns formed in the substrate may be formed of materials including silicon or silicon containing materials such as silicon oxide, silicon nitride, polycrystalline silicon, or monocrystalline silicon; or metal or metal containing materials such as titanium nitride, tungsten, ruthenium, tantalum nitride, tin;

or mixtures of the foregoing. Substrate treatment apparatus 10 is provided with processing chamber 11, substrate holder 12, heating portion 13, driving portion 14, and liquid supplier 15. Substrate holder 12, driving portion 14, and liquid supplier 15 are provided inside processing chamber 11. Substrate holder 12 is generally shaped like a circular disc. Substrate holder 12 is capable of holding the workpiece substrate 80 in the horizontal orientation with high precision. Substrate 80 is disposed above the upper surface of substrate holder 12. Substrate holder 12 is driven in rotation by driving portion 14.

Liquid supplier 15 is one example of a liquid supplying unit that supplies liquid containing sublimating material to the surface of substrate 80 held by substrate holder 12. In other words, liquid supplier 15 carries out a liquid supplying process in which a liquid containing sublimating material is supplied to the surface of substrate 80 held by substrate holder 12.

Liquid supplier 15 is provided for example with piping 16 and nozzle 17 connected to piping 16. Liquid supplier 15 discharges, from nozzle 17, the liquid supplied through piping 16 from another component toward a central portion of substrate 80 disposed above substrate holder 12. In the meantime, substrate holder 12 is driven in rotation by driving portion 14 to consequently rotate substrate 80. The liquid discharged from liquid supplier 15 is supplied over the rotating substrate 80 and coated substantially evenly over the entirety of substrate 80 by centrifugal force.

The liquid supplied by liquid supplier 15 is a melt of sublimating material or a dissolution of sublimating material into a solvent. In other words, the liquid supplied by liquid supplier 15 contains sublimating material. Sublimating material is a material having sublimating properties and being capable of phase transfer from the solid phase to the gas phase at a certain temperature under normal pressure or reduced pressure. For example, sublimating materials include, but not limited to, naphthalene, P-dichlorobenzene, camphor, and 1, 7-naphthalenediol. Further, solvents for dissolving the sublimating material include, but not limited to, water, methanol, propanol, isopropylalcohol, cyclohexane, formic acid, carbolic acid, pyridine, diethylamine, dimethyl amine, ethylenediamine, triethylamine, dimethylacetamide, diethylacetamide, formamide, or the like, for example.

In the first embodiment, isopropylalcohol (hereinafter referred to as IPA) is used as the solvent. Further, in the following description, a liquid melt of sublimating material or a liquid obtained by dissolution of sublimating material into a solvent is referred to as a sublimating material containing liquid. In addition to a nozzle for discharging sublimating material containing liquid, liquid supplier 15 may be provided for example with a nozzle for discharging a cleaning liquid, a nozzle for discharging a rinse liquid such as pure water, and/or the like. For example, the cleaning liquid may be, but not limited to, an aqueous solution containing fluoric acid, phosphoric acid, hydrochloric acid, ammonia, hydrogen peroxide water, or a combination of the foregoing.

Heating portion 13 is provided inside substrate holder 12 and is configured to heat substrate 80 placed on substrate holder 12. Heating portion 13 is one example of a precipitating unit and carries out the precipitating process. Heating portion 13 is further one example of a sublimation removing unit and carries out the sublimation removing process. One example of heating portion 13 is, but not limited to, an electric heater. When heating portion 13 is driven and substrate 80 placed on substrate holder 12 is heated, a portion of the sublimating material containing liquid coated over substrate 80 is vaporized. This causes precipitation of sublimating material, contained in the sublimating material containing liquid, on substrate 80. Continued heating of substrate 80 causes sublimation of the precipitate of the sublimating material. As a result, the sublimating material existing on substrate is removed by sublimation.

Substrate treatment apparatus 10 is provided with controller 18, vacuum pump 19, and detector 20. Controller 18 is configured by a computer provided with CPU, RAM, ROM, and the like which are not shown and is responsible for the overall control of substrate treatment apparatus 10. In other words, driving of heating portion 13, driving portion 14, liquid supplier 15, vacuum pump 19, and detector 20 is controlled by controller 18.

Vacuum pump 19 and detector 20 are provided outside processing chamber 11. Vacuum pump 19 is connected to the interior of processing chamber 11 via connecting portion 21. Detector 20 is provided between vacuum pump 19 and processing chamber 11. When vacuum pump 19 is driven, the gas inside processing chamber 11 is sucked into vacuum pump 19 and detector 20 is thus, exposed to the gas. As a result, the gas inside processing chamber 11 is exhausted outside processing chamber 11 by vacuum pump 19.

Vacuum pump 19 is one example of a precipitating unit for carrying out the precipitation process. Vacuum pump 19 is also one example of a sublimation removing unit for performing sublimation removal. More specifically, the sublimating material contained in the sublimating material containing liquid discharged from liquid supplier 15 solidifies and precipitates when subjected to heating and/or depressurization. In such case, heating portion 13 and/or vacuum pump 19 serves as the precipitating unit. Further heating and/or depressurization causes sublimation of the precipitate of the sublimating material and produces organic gas. In such case, heating portion 13 and/or vacuum pump 19 serve as the sublimation removing unit.

Detector 20 is one example of a sublimation progress detector that detects the progress or the end point of sublimation removal of sublimating material existing on substrate 80. More specifically, detector 20 detects the organic gas produced during the sublimation of the sublimating material. Stated differently, detector 20 detects the variation in the gas component inside substrate treatment apparatus 10 caused by the sublimation of the sublimating material. Examples of detector 20 include for example, PID (Photo Ionization Detector), FID (Flame Ionization Detector), infrared absorbance detector, partial pressure vacuum detector, or the like.

[Control]

Next, a description will be given on the control executed by substrate treatment apparatus 10. As illustrated in FIG. 2, structures 81 such as a line-and-space pattern and a cylinder pattern for example are formed in or above the surface of substrate 80 by front end processes such as photolithography and etching. Then, substrate 80 is cleaned and dried by substrate treatment apparatus 10.

In the first embodiment, the width of structure 81 and the spacing between structures 81 are 20 nm or less for example. When the cleaning liquid is supplied to the surface of substrate 80, the liquid flows into the spaces between structures 81. When the liquid is vaporized for drying substrate 80, the liquid surface is lowered toward the base end side of structure 81 away from the tip or the free end side of structure 81. As a result, the surface tension of the liquid pulls the adjacent structures 81 together. When the width of structure 81 and the spacing between structures 81 are equal to or less than 20 nm, structure 81 may collapse by the surface tension of the liquid. Thus, in the first embodiment, substrate 80 is dried by the following process steps.

Figure 3:
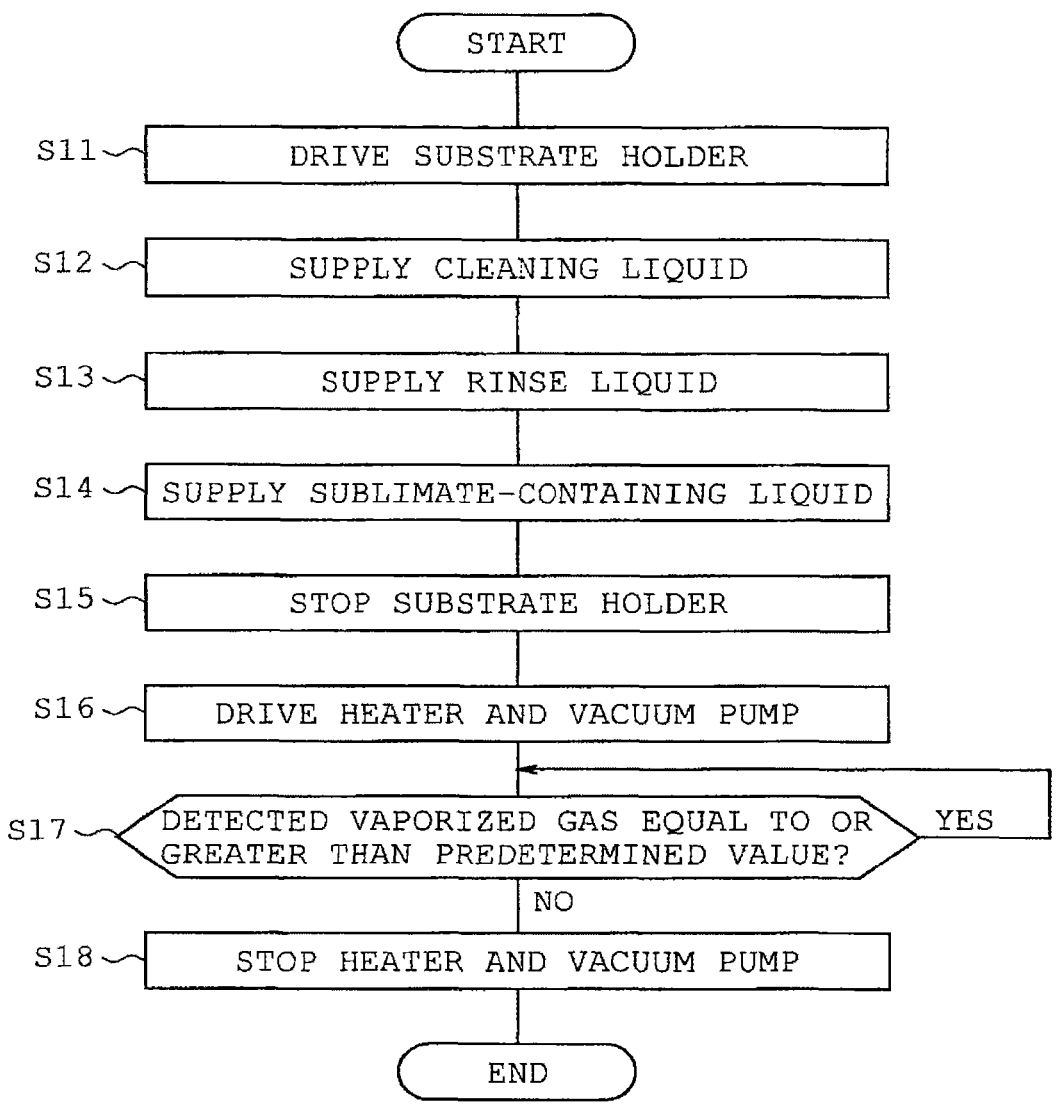
FIG. 3 is a flowchart indicating one example of a control executed by a controller.

Substrate 80 is placed on substrate holder 12 of substrate treatment apparatus 10 after completing the front end processes such as photolithography and etching. Then controller 18 starts the control flow indicated in FIG. 3 and executes the cleaning process of substrate 80 at steps S11, S12, and S13. More specifically, controller 18 drives drive portion 14 at step S11 and rotates substrate 80 with substrate holder 12. Then, at step S12, controller 18 discharges cleaning liquid 91 indicated in FIG. 2A from liquid supplier 15. Thus, cleaning liquid 91 spreads substantially evenly across the entire surface of substrate 80 by the centrifugal force exerted by the rotation of substrate 80. Cleaning liquid 91 washes away the etch residues and particles adhered to substrate 80 from the preceding processes.

Figure 2A:
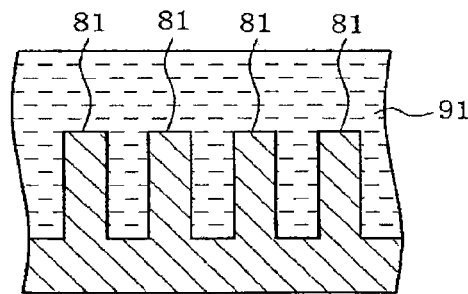
FIGS. 2A, 2B, 2C, 2D, and 2E are examples of cross-sectional views of a substrate and illustrates one example of a drying process in chronological order.
Figure 2B:
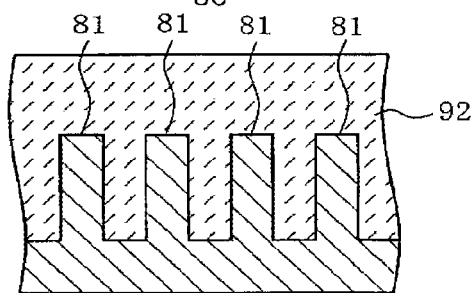

Then, at step S13, controller 18 discharges rinse liquid 92 illustrated in FIG. 2B from liquid supplier 15. Thus, rinse liquid 92 spreads substantially evenly across the entire surface of substrate 80 by the centrifugal force exerted by the rotation of substrate 80. Then, cleaning liquid 91 adhered to substrate 80 is substituted by rinse liquid 92.

Then, controller 18 executes step S14 as one example of a liquid supplying process. In step S14, controller 18 discharges sublimating material containing liquid 93 illustrated in FIG. 2C from liquid supplier 15 while the surface of substrate 80 is still covered by rinse liquid 92. Thus, sublimating material containing liquid 93 spreads substantially evenly across the entire surface of substrate 80 by the centrifugal force exerted by the rotation of substrate 80. Then, rinse 92 adhered to substrate 80 is substituted by sublimating material containing liquid 93. The solvent of sublimating material containing liquid 93 and rinse liquid 92 discharged at step S13 are preferably the same or have affinity for one another.

Figure 2C:
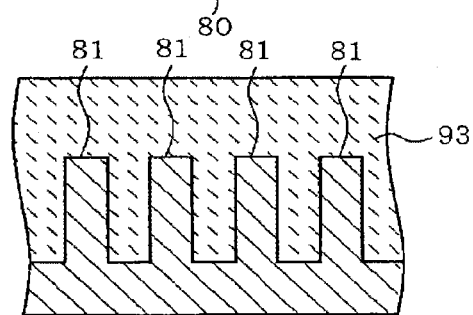
Figure 2D:
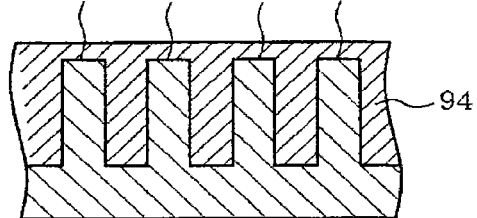

Next, at step S15, controller 18 stops the rotation of substrate holder 12. Then, controller 18 executes steps S16 and S17 as examples of a precipitating process and a sublimation removing process. At step S16, controller 18 heats substrate 80 by driving heating portion 13 while depressurizing the interior of processing chamber 11 by driving vacuum pump 19. As a result, the solvent of sublimating material containing liquid existing on substrate 80 is vaporized and sublimating material 94 contained in sublimating material containing liquid 93 precipitates to the surface of substrate 80 as illustrated in FIG. 2D. In other words, sublimating material containing liquid 93 fills the spaces between structures 81 and solidifies. The precipitate of sublimating material 94 provides support to structures 81.

When the temperature of substrate 80 is further elevated and pressure is further reduced in processing chamber 11 from the state of step S16, sublimating material 94 existing on substrate 80 becomes sublimated. The sublimation of sublimating material 94 produces organic vaporized gas for example. Controller 18 executes step 317 as one example of a sublimating progress detection process. At step S17, controller 18 detects the vaporized gas produced by the sublimation of sublimating material 94 by way of detector 20. Controller 18 determines that the sublimation of sublimating material is ongoing when the concentration of the vaporized gas detected by detector 20 is equal to or greater than a predetermined value (Step S17: YES). Thus, controller 18 determines that sublimating material 94 is remaining on substrate 80 and continues to drive heating portion 13 and vacuum pump 19. The sublimation of sublimating material may be facilitated by, but not limited to, raising the temperature of heating portion 13 or by increasing the exhaust speed of processing chamber 11.

Figure 2E:
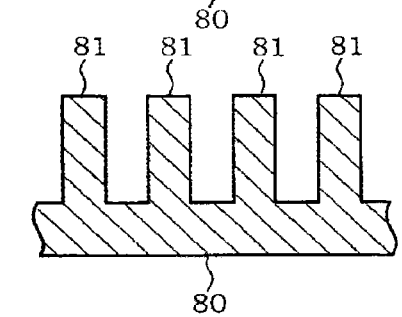

On the other hand, controller 18 determines that the sublimation of sublimating material has been completed when the concentration of the vaporized gas detected by detector 20 is less than a predetermined value (Step S17: NO). Thus, controller 18 determines that there is no sublimating material 94 remaining on substrate 80 and proceeds to step S18. At step S18, controller 18 stops heating portion 13 and vacuum pump 19 to terminate the control flow. Drying of substrate 80 is completed in the above described manner and sublimating material 94 is removed by sublimation removal to obtain substrate 80 free of sublimating material 94 as illustrated in FIG. 2E.

In the first embodiment described above, it is possible to prevent collapse of structures 81 originating from liquid surface tension even when the width of structure 81 and the spacing between structures 81 are narrow for example so as to be equal to or less than 20 nm, since the precipitates of sublimating material 94 residing between structures 81 supports structures 81.

Further, substrate treatment apparatus 10 is provided with detector 20 for detecting the progress and the end point of sublimation removal of sublimating material 94 precipitated on substrate 80. As a result, it is possible to determine the end of the sublimation removal of sublimating material 94 in a uniform and consistent manner by controller 18 without relying on the eyes of the operator or SEM. It is thus, possible to properly detect the end of the drying process in which sublimating material 94 is removed by sublimation removal. Because it is possible to reduce instances of sublimation material 94 remaining on substrate 80, it is possible to prevent redo of the drying process, and thereby improve the quality and the yield of the manufacturing process.

Detector 20 is configured to detect organic gas produced during the sublimation of sublimating material 94, in other words, the components contained in the vaporized gas. In the drying process, even if sublimating material 94 is removed by sublimation from some portions of substrate 80, there may be sublimating materials 94 remaining in other portions of substrate 80. Thus, there may be variation in the accuracy of detection since there may be sublimating material 94 remaining in some portions of substrate 80 when the progress and the end point of sublimation removal of sublimating material 94 is detected at only one detection site.

In the first embodiment, on the other hand, detector 20 is configured to detect organic gas produced during the sublimation of sublimating material 94. Thus, controller 18 does not determine that the end point of sublimation removal has been reached while organic gas is being detected by detector 20. Controller 18 detects that the end point of sublimation removal has been reached when organic gas is no longer detected by detector 20 as the result of sublimating material 94 being removed by sublimation from the entire substrate 80. The first embodiment is capable of reducing the variation in the sublimation of sublimating material 94 from the entire substrate 80 as compared to a configuration in which the detection is performed at a single detection site.

Method of removing sublimating material 94 by sublimation is not limited to the use of heating portion 13 provided in substrate holder 12. For example, light or electron beam may be irradiated on sublimating material 94 precipitated on substrate 80 to cause sublimating material 94 to be sublimated and thereby removed. For example, sublimating material may be removed by sublimation by RIE (Reactive Ion Etching) or the like. Alternatively, the entire space may be heated.

The control executed by controller 18 after detecting the progress and the end point of sublimation removal is not limited to the control described above. For example, controller 18 may continue to execute the sublimation removal process of sublimating material 94 for a predetermined period even after determining that removal of sublimating material 94 by sublimation has been completed (FIG. 3, Steps S17: NO) Stated differently, controller 18 may continue to heat substrate 80 by heating portion 13 or drive vacuum pump 19 for a predetermined period when the concentration of vaporized gas produced by sublimation of sublimating material 94 has become less than a predetermined value (FIG. 3, step S: NO). This will allow sublimating material 94 to be removed from substrate 80 more reliably.

(Second Embodiment)

Figure 4:
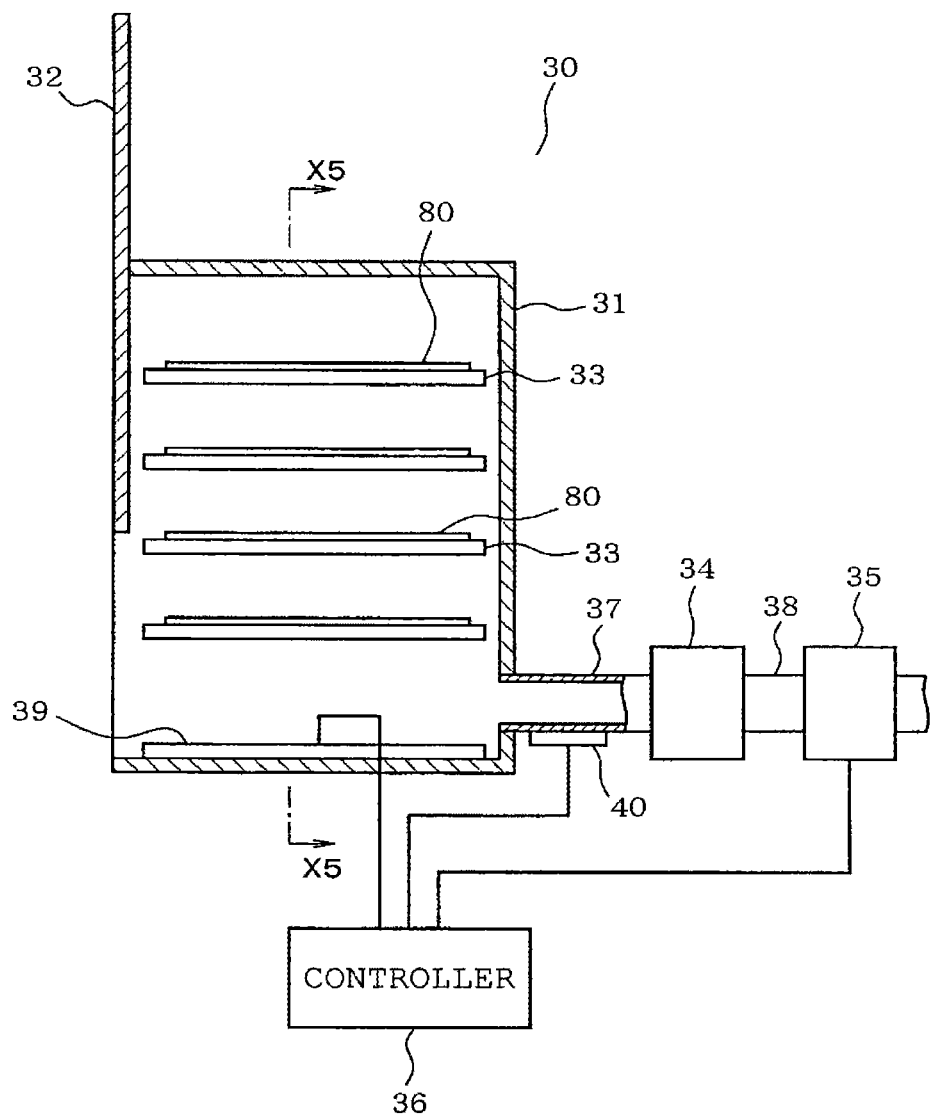
FIG. 4 is one example of the overall structure of a substrate treatment apparatus of a second embodiment.

Next, a description will be given on a second embodiment with reference to FIG. 4 to FIG. 6.

Substrate treatment apparatus 30 of the second embodiment executes a drying process of for example a semiconductor substrate. More specifically, substrate treatment apparatus 30 executes steps S16, S17, and S18 indicated in FIG. 3 of the first embodiment. Substrate treatment apparatus 30 is provided with processing chamber 31, door 32, substrate holder 33, collector 34, vacuum pump 35, and controller 36. Controller 36, being substantially identical in structure to controller 18 of the first embodiment, is responsible for controlling the overall operation of substrate treatment apparatus 30.

Processing chamber 31 is shaped like a box having an opening on one of its surfaces. Processing chamber 31 is capable of storing multiple substrates 80 inside it. Thus, processing chamber 31 is capable of batch processing of multiple substrates 80. One or more substrates 80 having completed liquid processing, such as a cleaning process, may be stored in processing chamber 31. More specifically, substrate 80 provided with a coating of sublimating material-containing liquid 93 as illustrated in FIG. 2C or substrate 80 filled with sublimating material 94 as illustrated in FIG. 2D may be stored in processing chamber 31.

Door 32 is opened or closed to allow/disallow access to processing chamber 31 through the opening. When door 32 is closed, a sealed space is created in processing chamber 31. The opening/closing of door 32 is controlled by controller 36. Inside processing chamber 31, multiple substrate holders 33 are disposed one over the other in the up and down direction. Each substrate holder 33 is capable of holding a single substrate 80. Because a single substrate 80 is held by a single substrate holder 33, substrates 80 are disposed one over the other in the up and down direction with spacing in processing chamber 31.

Collector 34 and vacuum pump 35 are provided outside processing chamber 31. Collector 34 is provided between vacuum pump 35 and processing chamber 31. Collector 34 is connected to the interior of processing chamber 31 via connecting portion 37. Collector 34 and vacuum pump 35 are connected by connecting portion 38. Driving of vacuum pump 35 is controlled by controller 36. When vacuum pump 35 is driven, the gas inside processing chamber 31 is sucked into vacuum pump 35 through collector 34. Collector 34 is provided with components such as a filter not shown. Collector 34 is capable of collecting sublimating materials contained in the gas passing therethrough by adsorption.

Substrate treatment apparatus 30 is provided with first heating portion 39 and second heating portion 40. First heating portion 39 may be provided anywhere as long as it is disposed on at least one of the inner surfaces of processing chamber 31. One example of first heating portion 39 and second heating portion 40 is but not limited to an electric heater. Driving of first heating portion 39 and second heating portion 40 is controlled by controller 36. First heating portion 39 is provided inside processing chamber 31 and is capable of heating the entire interior of processing chamber 31. Accordingly, first heating portion 39 is capable of heating the gas inside processing chamber 31. Second heating portion 40 is provided in connecting portion 37 connecting processing chamber 11 and collector 34. Accordingly, second heating portion 40 is capable of heating the gas passing through connecting portion 37.

The temperature inside connecting portion 37 is preferably higher than the temperature inside processing chamber 31. In the second embodiment, controller 36 controls second heating portion 40 so that the temperature inside connecting portion 37 is higher than the temperature inside processing chamber 31. Thus, it is possible to inhibit the sublimating material contained in the vaporized gas sublimated from substrate 80 from precipitating by being cooled inside connecting portion 37 before the sublimating material reaches collector 34. Alternatively, the temperature inside collector 34 may be cooled so as to be lower than the temperatures inside processing chamber 31 and connecting portion 37. Stated differently, collector 34 may be used as the so called cold trap. Under such configuration, the sublimating material precipitates by being cooled inside collector 34. Thus, it is possible to collect the sublimating material more effectively.

Figure 5:
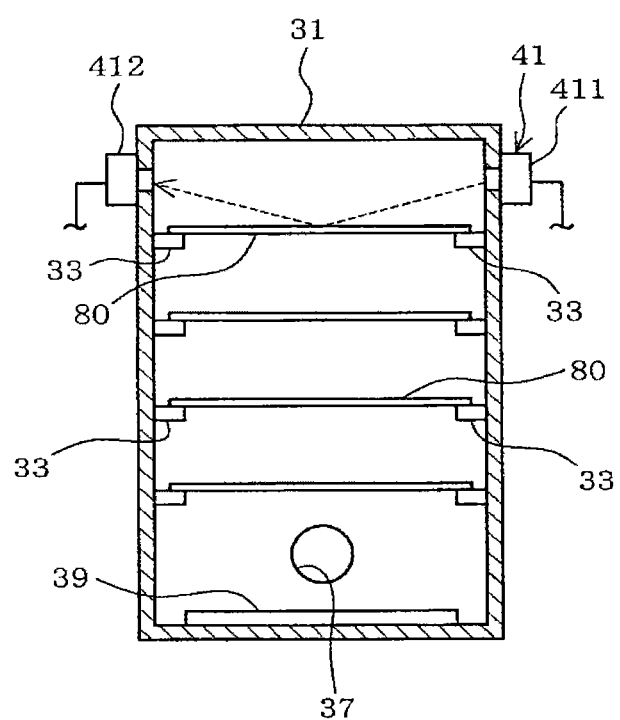
FIG. 5 is one example of a cross-sectional view taken along line X5-X5 of FIG. 4.

Substrate treatment apparatus 30 is provided with detector 41 as illustrated in FIG. 5. Detector 41 is one example of a sublimation status detecting unit that detects the progress or the end point of sublimation of sublimating material 94 residing on substrate 80. In other words, detector 41 carries out the process of detecting of the progress or the end point of sublimation of sublimating material 94.

Detector 41 is one example of a detecting unit that detects the progress and the end point of sublimation based on reflected light resulting from light irradiated on the surface of substrate 80. The properties of light reflecting from the surface of substrate 80 differs depending upon the presence/absence of sublimating material 94 on substrate 80. Detector 41 is capable of detecting the presence/absence of sublimating material 94 on the surface of substrate 80 by detecting the variation of reflected light at the surface of substrate 80.

More specifically, detector 41 is connected to controller 36 and is driven in a controlled manner by controller 36. Detector 41 is provided with light projecting portion 411 and light receiving portion 412. The light irradiated from light projecting portion 411 scatters and reflects from the surface of substrate 80. The scattered light contained in the reflected light is detected by light receiving portion 412. Controller 36 is capable of detecting the presence/absence of sublimating material 94 residing on substrate 80 by calculating the difference of the spectrum of light irradiated from light projecting portion 411 and the spectrum of reflected light received by light receiving portion 412.

It is possible to obtain the operation and effect similar to those of the first embodiment by the above described configuration.

Processing chamber 31 is capable of storing multiple substrates 80 at the same time. First heating portion 39 is capable of heating the entire interior of processing chamber 31. Thus, substrate treatment apparatus 30 is capable of carrying out the drying process for multiple substrates 80 at the same time. It is possible to improve work efficiency and productivity since substrate treatment apparatus 30 is capable of batch processing of multiple substrates 80.

Among the multiple substrates 80 stored in processing chamber 31, detector 41 is configured to detect a piece of substrate 80 which is most distant from first heating portion 39. In the second embodiment for example, first heating portion 39 is provided on the bottom portion of processing chamber 31 interior. Thus, detector 41 of the second embodiment is configured to detect the topmost substrate 80 disposed in the processing chamber 31. This is because it becomes increasingly difficult for temperature elevation to occur in substrate 80 as the distance from first heating portion 39 becomes greater. In other words, if the end point of sublimation removal of sublimating material 94 can be detected for substrate 80 in which temperature elevation is most difficult, it can be presumed that other substrates 80 have already reached their end points.

Thus, even if substrate treatment apparatus 30 is a batch processing apparatus in which detector 41 is configured to directly detect the surface conditions of substrate 80, detector 41 need not be provided on every substrate 80. Thus, in the second embodiment, it is possible to reduce the variation in the sublimation taking place in each substrate 80 even when detection is carried out for only one of the multiple substrates 80 processed in a batch. Further, because detector 41 need not be provided for each substrate 80 it is possible to bring down the cost of substrate treatment apparatus 30.

Figure 6:
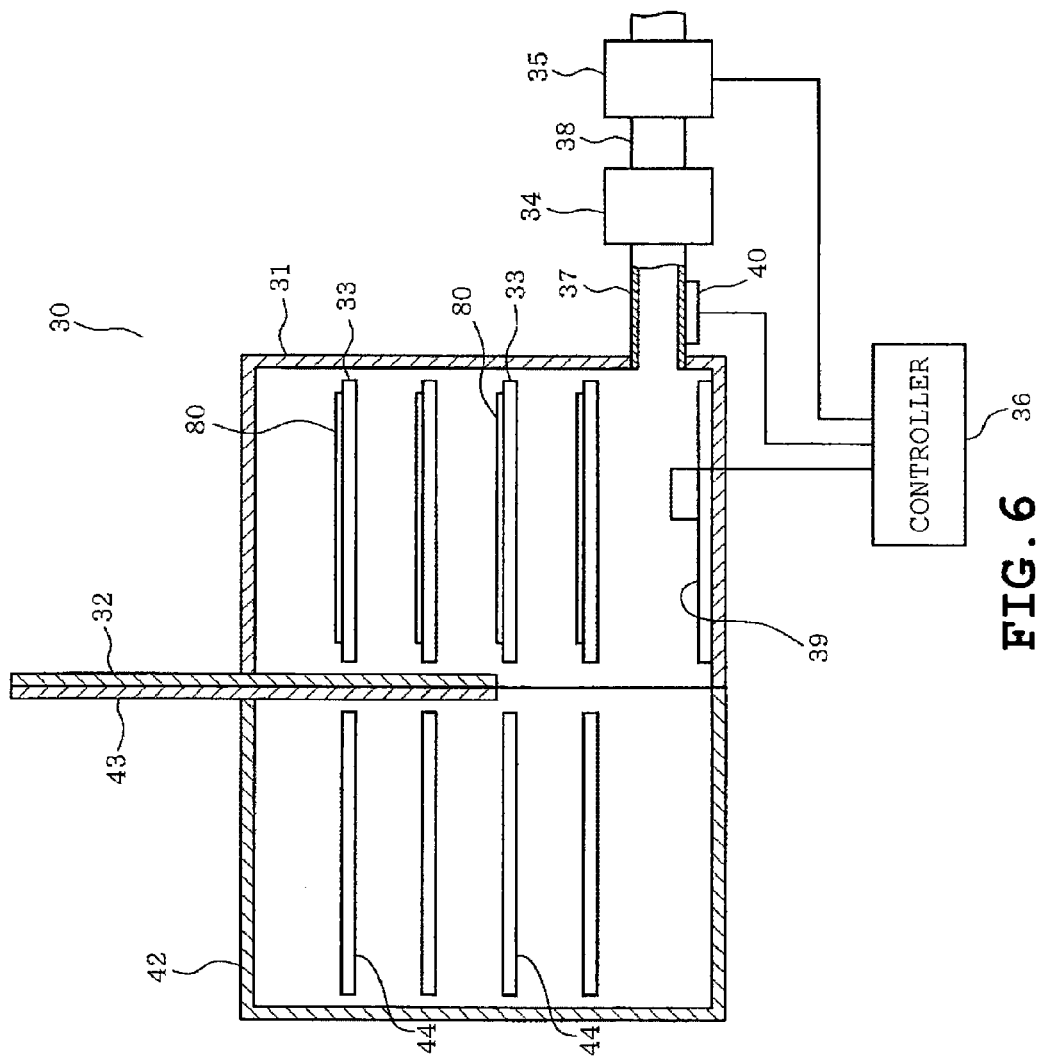
FIG. 6 is one example of the overall structure of a substrate treatment apparatus of a modified embodiment.

Processing chamber 31 may be connectable to reserve vacuum chamber 42 as illustrated in FIG. 6. Reserve vacuum chamber 42 is provided with door 43 which can be opened/closed by controller 36 and multiple substrate holders 44. Thus, reserve vacuum chamber 42 is capable of storing multiple substrates 80. It is possible to reduce the pressure inside reserve vacuum chamber 42 to subatmospheric pressure by vacuum pump 35 or other vacuum pump not illustrated. It is possible to transfer multiple substrates 80 to and from reserve vacuum chamber 42 and processing chamber 31 without exposing the interior of processing chamber 31 to the atmosphere by opening doors 32 and 43 after reserve vacuum chamber 42 is depressurized with doors 32 and 43 closed. Reserve vacuum chamber 42 may be configured to be detachable from and attachable/reattachable to processing chamber 31 and may serve as a container to transfer substrates 80 stored therein to subsequent process steps.

(Third Embodiment)

Figure 7:
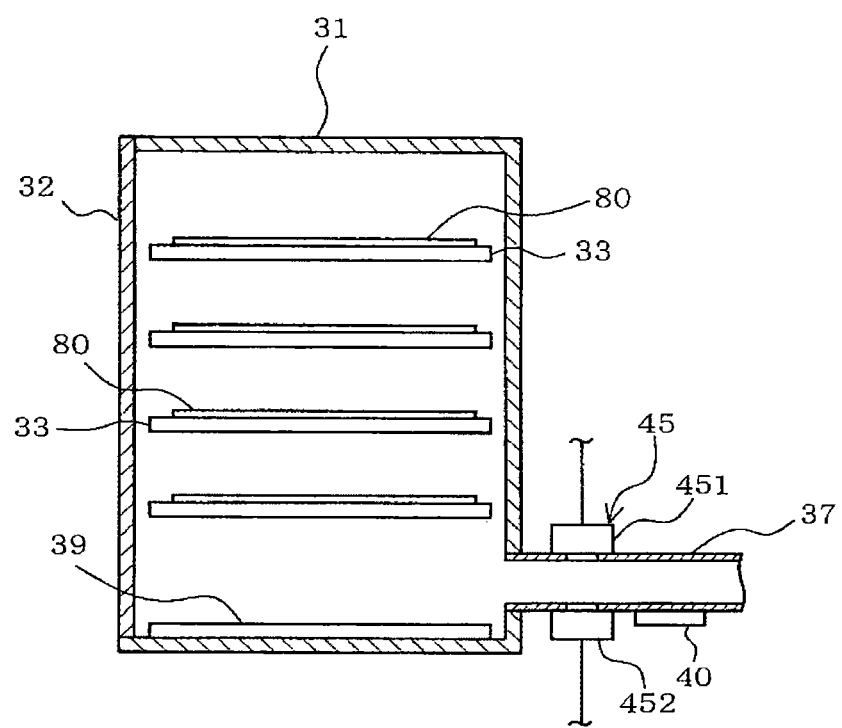
FIG. 7 pertains to a third embodiment and illustrates examples of structures near a processing chamber.

Next, a description will be given on a third embodiment with reference to FIG. 7. Substrate treatment apparatus 30 of the third embodiment is provided with detector 45 instead of detector 41 of the second embodiment, etc. Detector 45 is one example of a sublimation status detecting unit that detects the progress and the end point of sublimation of sublimating material 94 residing on substrate 80. In the third embodiment, detector 45 is one example of a photo detecting unit that detects the progress and the end point of sublimation based on light absorption, fluorescence, or light emission of gas produced by the sublimation of sublimating material 94.

Detector 45 detects the progress and the end point of sublimation based on light absorption of gas produced by the sublimation of sublimating material 94. More specifically, detector 45 detects the progress and the end point of sublimation of sublimating material 94 as follows. For example, detector 45 irradiates light on vaporized gas, i.e. gas produced by the sublimation of sublimating material 94 and detects the progress and the end point of sublimation of sublimating material 94 based on the variation in the light absorption of the irradiated light. Detector 45 may employ, but not limited to, an infrared spectroscopy, a raman spectroscopy, or the like.

More specifically, detector 45 is connected to controller 36 and is driven in a controlled manner by controller 36. Detector 45 is provided with light projecting portion 451 and light receiving portion 452. A portion of the light irradiated from light projecting portion 451 is absorbed by the gas containing sublimating material 94 and some portions of light is received by light receiving portion 452. Detector 45 is capable of detecting the end point of the sublimation removal of sublimating material 94 by detecting the variation in the absorption of light by gas.

Detector 45 is provided in connecting portion 37 connecting processing chamber 31 and collector 34. The vaporized gas containing sublimating material 94 is sucked through connecting portion 37 by vacuum pump 35. Thus, gas flow oriented toward vacuum pump 35 from processing chamber 31 is produced in connecting portion 37. This inhibits the vaporized gas containing sublimating material 94 from being detained in a certain location and thereby allows detector 45 to reliably detect the variation originating from sublimation removal. Detector 45 need not be provided in connecting portion 37 as long as it is placed in the path extending from the interior of processing chamber 31 into collector 34.

The third embodiment also provides the operation and effect similar to those of the foregoing embodiments.

Detector 45 may alternatively be configured to detect the end point of sublimation removal based on the florescence or light emission of gas produced by the sublimation of sublimating material 94. More specifically, detector 45 may be configured to cause florescence or light emission by applying high voltage on the vaporized gas produced by the sublimation of sublimating material 94, and thereby detect the end point of sublimation removal of sublimating material 94 based on the variation of florescence or light emission. In such case, detector 45 is provided with voltage applying portion 451 capable of applying high voltage on the produced gas instead of light projecting portion 451. When voltage applying portion 451 applies high voltage on the produced gas, it reacts with the produced gas to cause florescence or light emission. The florescence or light emission is detected by light receiving portion 452. Thus, detector 45 is capable of detecting the end point of sublimation removal of sublimating material 94 by detecting the variation of florescence or light emission of gas.

(Fourth Embodiment)

Figure 8:
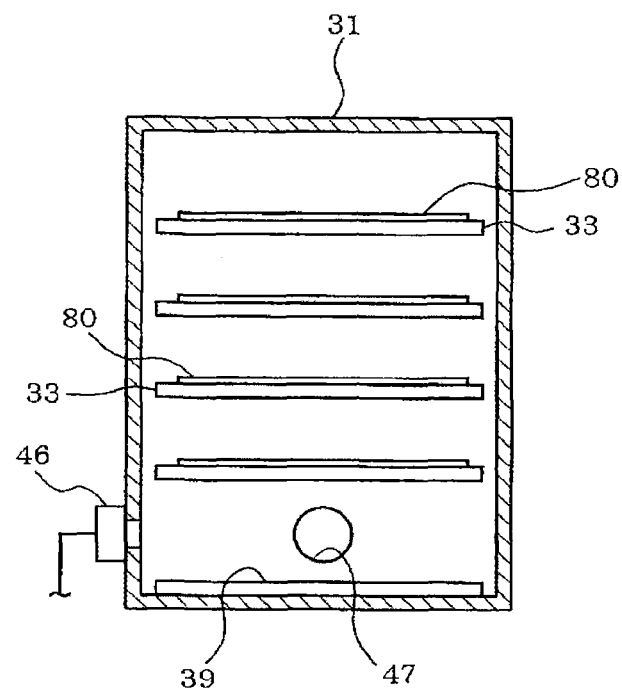
FIG. 8 pertains to a fourth embodiment and illustrates one example of a cross-sectional view taken along line X5-X5 of FIG. 4.

Next, a description will be given on a fourth embodiment with reference to FIG. 8. Substrate treatment apparatus 30 of the fourth embodiment is provided with detector 46 instead of detector 41 of the second embodiment, etc. Detector 46 is disposed, but not limited to, the vicinity of the bottom portion of processing chamber 31. Detector 46 is one example of a sublimation status detecting unit that detects the progress and the end point of removal, by sublimation, of sublimating material 94 residing on substrate 80. In the fourth embodiment, detector 46 is one example of a pressure detecting unit that detects the progress and the end point of sublimation based on the variation of pressure of gas produced by the sublimation of sublimating material 94. For example, controller 36 determines that the sublimation of sublimating material 94 residing on substrate 80 is completed when the pressure detected by detector 46 is less than a predetermined value.

Examples of detector 46 may include a vacuum gauge utilizing mechanical phenomena of sublimating material 94, a vacuum gauge utilizing transport phenomena of sublimating material 94, a vacuum gauge configured to detect sublimating material 94 by disassociation. Further, detector 46 may be used which is configured to analyze the mass amount of sublimating material 94 contained in vaporized gas. The fourth embodiment is also capable of achieving the operation and effect similar to those of the foregoing embodiments.

(Fifth Embodiment)

Figure 9:
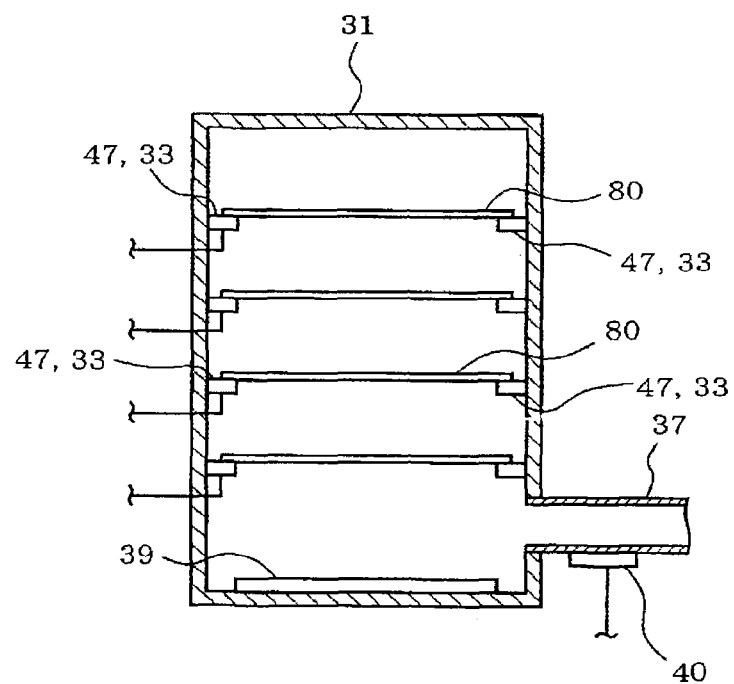
FIG. 9 pertains to a fifth embodiment and illustrates examples of structures near the processing chamber.

Next, a description will be given on a fifth embodiment with reference to FIG. 9. Substrate treatment apparatus 30 of the fifth embodiment is provided with detector 47 instead of detector 41 of the second embodiment, etc. Detector 47 is one example of a sublimation status detecting unit that detects the progress or the end point of removal, by sublimation, of sublimating material 94 residing on substrate 80. In the fifth embodiment, detector 47 is one example of a substrate weight detecting unit that detects the progress and the end point of sublimation based on the variation of the weight of substrate 80 caused by the sublimation of sublimating material 94. For example, detector 47 may be installed in substrate holder 33 and detect the weight of substrate 80 placed on substrate holder 33.

For example, when substrate 80 is a silicon wafer having a diameter of 300 mm and a thickness of 750 μm, substrate 80 weighs approximately 128 g. The precipitation of sublimating material 94 on substrate 80 increases the weight of substrate 80 by approximately 0.01 to 0.03 g. Detector 47 is capable of detecting the end point of the removal of sublimating material 94 by sublimation through detection of variation in the weight of substrate 80. The precision of end point detection may be improved for example by configuring controller 36 to statistically analyze the weight of substrate 80 at the end of the drying process and feedback the results of the statistical analysis to the reference value applied in end point detection.

The fifth embodiment described above also achieves the operation and effect similar to those of the foregoing embodiments.

In the foregoing embodiments, the substrate treatment apparatus is provided with a sublimation removing unit configured to remove, by sublimation, a sublimating material filled between structures formed on a surface of a substrate held by the substrate holder, and a sublimation status detecting unit configured to detect a progress or an end point of sublimation removal of the sublimating material.

Such configuration allows the progress and the end point of sublimation of sublimating material to be determined uniformly without having to rely on the eyes of the operator or to the observation by SEM. Thus, it is possible to detect and determine the appropriate timing of the completion of the drying process carried out by sublimation of a sublimating material.

The embodiments may work independently or may work in combination with one another.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate treatment apparatus comprising:
    a processing chamber configured to be capable of storing a substrate;
    a substrate holder disposed in the processing chamber and configured to be capable of holding the substrate;
    a sublimation removing unit configured to remove, by sublimation, a sublimating material filled between structures formed on a surface of a substrate held by the substrate holder;
    a sublimation status detecting unit configured to detect a progress or an end point of sublimation removal of the sublimating material;
    a liquid supplying unit configured to supply, to a surface of the substrate, a sublimating material containing liquid containing a sublimating material; and
    a precipitating unit configured to precipitate the sublimating material between the structures by vaporizing a portion of the sublimating material containing liquid supplied to the surface of the substrate.

2. The apparatus according to claim 1, wherein the sublimation status detecting unit comprises a flame ionization detector.

3. The apparatus according to claim 1, wherein the sublimation status detecting unit comprises a photo ionization detector.

4. The apparatus according to claim 1, wherein the sublimation status detecting unit comprises a photo detector configured to detect light absorption or florescence or light emission of gas produced by the sublimation of the sublimating material.

5. The apparatus according to claim 1, wherein the sublimation status detecting unit comprises a pressure detector configured to detect a variation of pressure of gas produced by the sublimation of the sublimating material.

6. The apparatus according to claim 1, wherein the sublimation status detecting unit comprises a substrate weight detector configured to detect a variation of weight of the substrate caused by the sublimation of the sublimating material.

7. The apparatus according to claim 1, wherein the processing chamber is configured to be capable of simultaneously storing two or more substrates, and
    wherein the sublimation removing unit comprises a heating portion configured to be capable of heating an interior of the processing chamber, and
    wherein the sublimation status detecting unit is configured to detect the progress or the end point of sublimation removal of the sublimating material based on a reflected light resulting from irradiation of light on a surface of a substrate most distant from the heating portion among the two or more substrates.

8. A method of treating a substrate comprising:
    supplying a sublimating material containing liquid containing a sublimating material to a substrate having structures formed on a surface thereof;
    precipitating the sublimating material between the structures by vaporizing the sublimating material containing liquid supplied to the surface of the substrate;
    removing, by sublimation, the sublimating material existing between the structures; and
    detecting a progress or an end point of removing the sublimating material by sublimation.

9. The method according to claim 8, wherein the detecting includes detecting, by a flame ionization detector, a variation of a component of gas produced by sublimation of the sublimating material.

10. The method according to claim 8, wherein the detecting includes detecting, by a photo ionization detector, a variation of a component of gas produced by sublimation of the sublimating material.

11. The method according to claim 8, wherein the detecting includes detecting light absorption or florescence or light emission of gas produced by sublimation of the sublimating material.

12. The method according to claim 8, wherein the detecting includes detecting a variation of pressure of gas produced by sublimation of the sublimating material.

13. The method according to claim 8, wherein the detecting includes detecting a variation of a weight of the substrate caused by sublimation of the sublimating material.

\* \* \* \* \*